United States Patent [19]

Borish et al.

[11] Patent Number: 4,535,474

[45] Date of Patent: Aug. 13, 1985

[54] AUDIO AMBIENCE SIMULATOR

[75] Inventors: Jeffrey G. Borish, Santa Clara; M. Dale Ewy, Cupertino, both of Calif.

[73] Assignee: Signal Research Laboratory, San Rafael, Calif.

[21] Appl. No.: 522,993

[22] Filed: Aug. 15, 1983

[51] Int. Cl.³ .............................................. H03G 3/00
[52] U.S. Cl. ........................................ 381/61; 381/18
[58] Field of Search ...................... 381/62, 63, 103, 18, 381/61; 84/DIG. 4, DIG. 26; 340/347 C

[56] References Cited

U.S. PATENT DOCUMENTS

| | | | |
|---|---|---|---|
| 4,130,726 | 12/1978 | Kates et al. | 381/103 X |
| 4,184,047 | 1/1980 | Langford | 381/63 |
| 4,219,880 | 8/1980 | Nichols | 381/63 X |
| 4,268,717 | 5/1981 | Moore | 381/63 |
| 4,275,267 | 6/1981 | Kurtin et al. | 381/18 |
| 4,283,600 | 8/1981 | Cohen | 381/61 |
| 4,472,993 | 9/1984 | Futamase et al. | 381/63 X |

FOREIGN PATENT DOCUMENTS

| | | | |
|---|---|---|---|
| 55-47797 | 4/1980 | Japan | 381/18 |
| 2004149 | 3/1979 | United Kingdom | 340/347 C |

OTHER PUBLICATIONS

J. A. Murdie, "Tech Tips: Digital Echo Unit", *Eletronics Today International*, vol. 7, No. 1, Jan. 1978.

*Primary Examiner*—Keith E. George
*Attorney, Agent, or Firm*—Thomas E. Schatzel

[57] ABSTRACT

An ambience simulating apparatus having a mixer for combining a plurality of at least two electrical analog signal representations of audio signals into a single analog signal, digitizing circuits for digitizing said single analog signal, a memory for storing the digital representation of said analog signal, and circuitry for selectively collecting, attenuating, and combining portions of the data stored in the memory, whereby a signal can be produced which represents the combination of a plurality of delayed and attenuated audio signals which when reproduced as an audio signal in combination with the reproduction of the audio signals from said plurality of electrical analog signals, creates a fullness of sound referred to as ambience.

14 Claims, 4 Drawing Figures

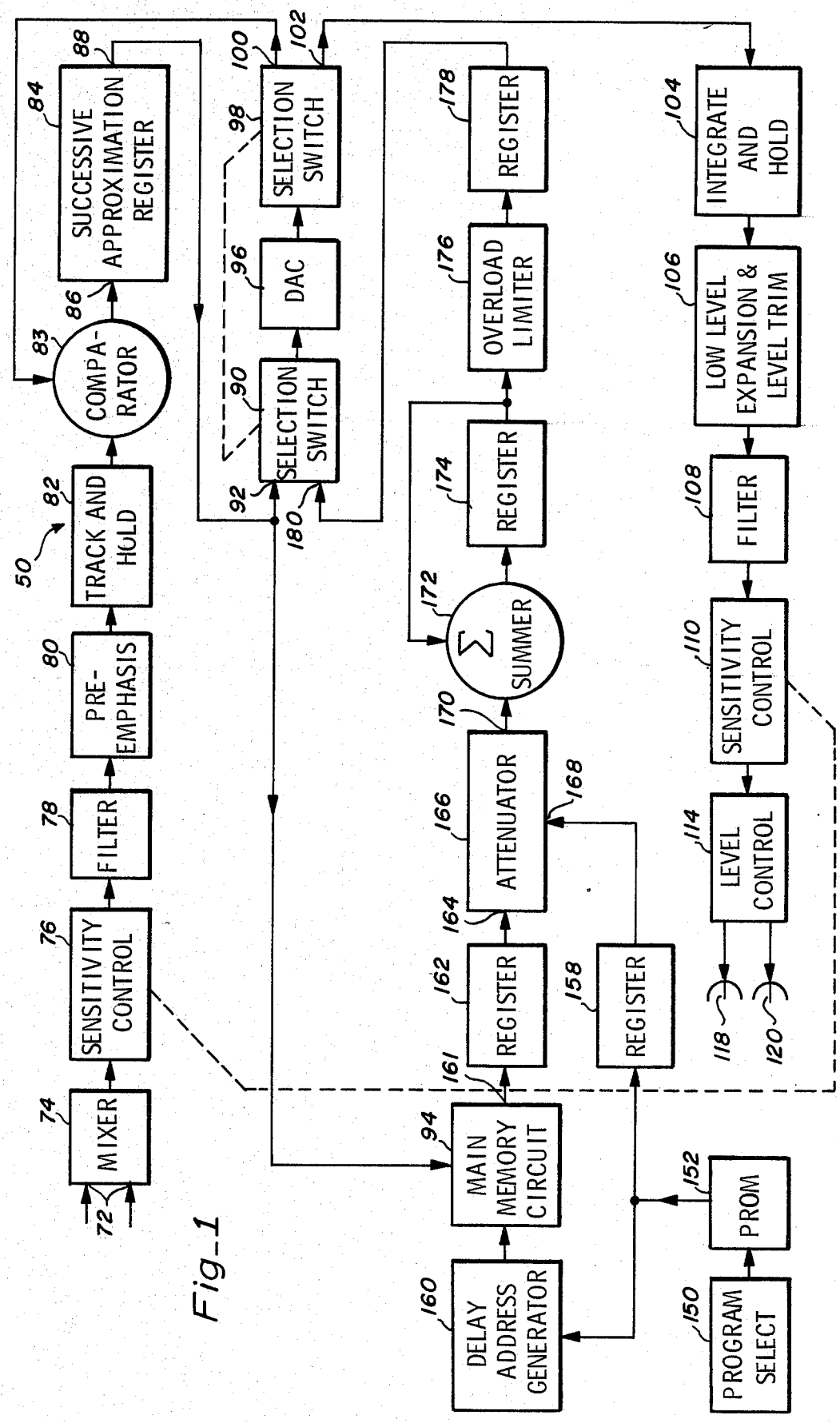
Fig_1

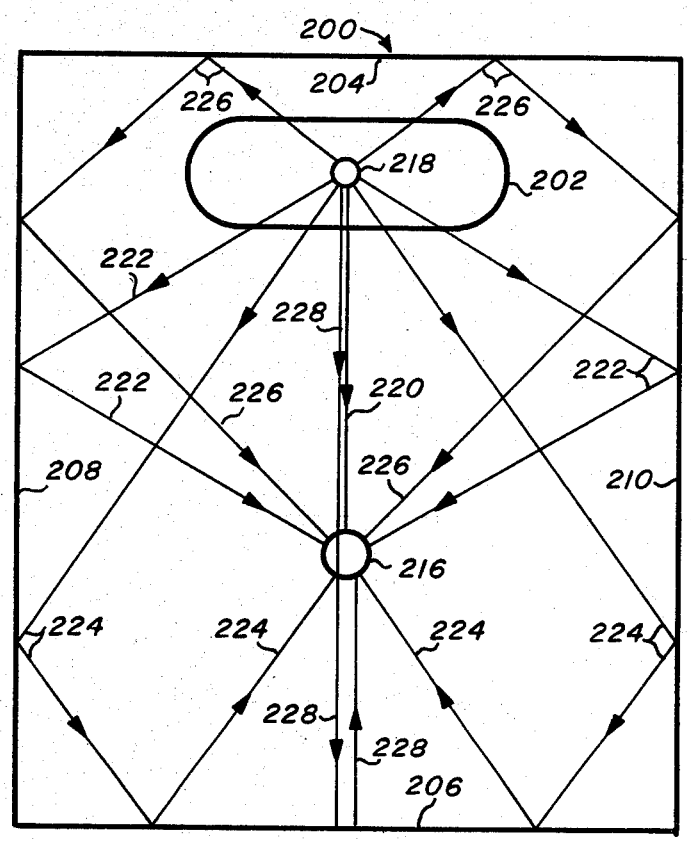
Fig_2
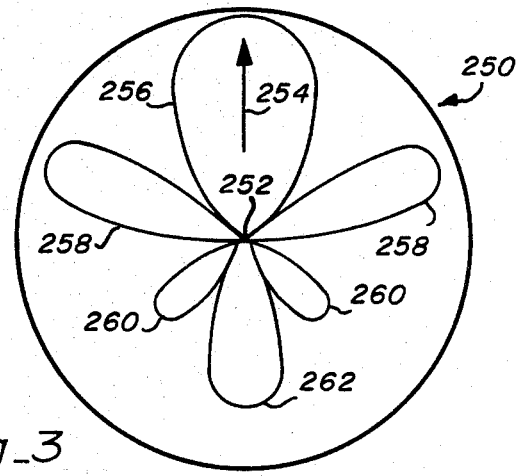
Fig_3
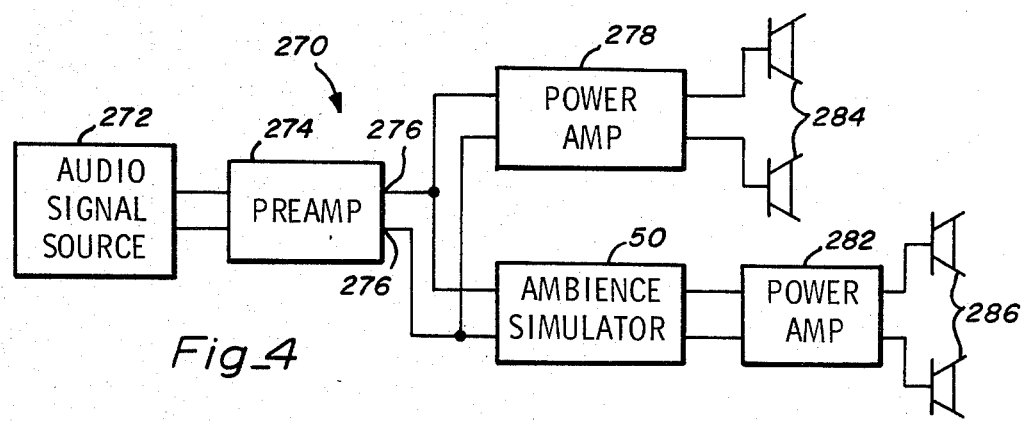
Fig_4

AUDIO AMBIENCE SIMULATOR

BACKGROUND OF THE INVENTION

1. Field of the Invention

The invention relates generally to the field of acoustic environment simulations, and more particularly to digital devices for providing an accurate simulation of the ambience created by sound reflections in auditoriums.

2. Description of the Prior Art

A relatively recent concern in audio recording and reproduction has developed regarding the effect on the listener of sound which is reflected from the surfaces within a concert hall or auditorium. Such reflections affect not only direction of perceived sound, but also the time that it takes for the sound to reach the listener. A large auditorium will produce reflected sounds which arrive at the listener after delays of substantially greater duration than anything that would naturally occur in a person's living room. An exact reproduction of the originally created sound in a small living room would sound considerably different than if that same sound were produced in a large concert hall. In fact, the same originally created sound produced in different auditoriums would sound different. Several approaches have been taken to provide for the production in the home of the effect of various concert halls.

Stereo itself represents a step toward providing realism to the home production of sounds, but cannot present a range of sound directions large enough to encompass the reflected sounds. Binaural recording does provide the reflected sounds, but is generally limited to playback by headphones. A quadraphonic sound system can provide a good representation of the effect of an auditorium if it has truly independent channels. Both binaural and quadraphonic systems require that the music be specially recorded to produce the effect desired. Hence, present stero systems and recordings not incorporating those practices are incompatible.

An alternative approach is to electronically simulate the effect of the concert hall reflections at the time the recorded sound is reproduced. This requires a simulator at the site of such reproduction of the sound, that is a simulator in the home. One significant advantage of this approach is that by building the simulator with some range of control over what it is simulating, a single simulator can be used to simulate more than one type of auditorium, and the choice is within the control of the home listener.

While the terminology used to refer to the delayed sounds caused by reflections is not yet universal, reverberation will be used herein to refer to all of such sounds, ambience will be used to refer to the early reflections (those reaching the listener after a short delay) and reverberance will be used to refer to the later delayed sounds. The distinction between ambience and reverberance is a matter of perception, and an elapsed time which divides the two can be anywhere from 50 ms to 150 ms depending on the size and shape of the auditorium. The distinction is based on the fact that the listener is able to perceive individual components of the sparser early sounds, whereas the density of reflections of the later reverberation is so great that they merge together in the perception of the listener. The larger the room, the longer the delay for the first reflections, and the greater the period of ambience.

One system of simulating the various delayed sounds which results from reflected sound is the invention of Cohen, U.S. Pat. No. 4,283,600, which describes a series of electronic delay lines with a speaker associated with the output of each delay line such that the total audio output is the composite of the speakers, all producing essentially the same signal, but at different amounts of time delay, thus providing a simulated ambience. The need for multiple speakers, and a power amplifier associated with each such speaker, may be unacceptable for some applications.

The invention of Morgan, U.S. Pat. No. 4,338,581, discloses a system wherein an analog signal is delayed through employment of various analog delay devices, and digital techniques are used for selecting the specific time delays and corresponding amplitudes for producing the resulting output signal. Morgan provides means by which the actual combination of selected delays and amplitudes can be programmed into the simulator. This system however has a very limited number of finite delays, and adds to those delays additional signals produced from a comb filter with exponential decay of the signal amplitudes. While this will produce a form of reverberation which may be pleasing, it does not allow the realistic simulation of the delays, amplitudes and directionality of the sounds of the entire period of ambience in normal auditoriums.

In U.S. Pat. No. 4,105,864, Berkovitz discloses a simulator which includes digitization of the sound, and storage in a digital memory. That invention uses multiple speakers as does Cohen, however, and it is a complicated process to change the amplitude and delay parameters.

SUMMARY OF THE PRESENT INVENTION

It is an object of the present invention to provide an economical ambience simulator which is capable of providing realistic simulations of selectable configurations of auditoriums.

It is a further object of the present invention to provide an ambience simulator in which the fidelity of the signal is preserved by storing digital representations of the audio signal in memory to obtain the time delays, and convenient control is provided by using digital data to select the delay times and relative signal amplitudes in producing the simulated signal.

Another object of the present invention is to provide such an ambience simulator, further including a preemphasis means and a deemphasis means so that the dynamic range of such ambience simulator is more effectively utilized, and the signal-to-noise ratio thereby improved.

Another object of the present invention is to provide such an ambience simulator, further including a low-level expansion circuit which increases the apparent dynamic range.

Another object of the present invention is to provide an ambience simulator for home use which is compatible with existing commercially utilized recording methods, commonly available home reproduction equipment, and presently prevalent recordings.

Briefly, a preferred embodiment of the present invention is an ambience simulator which includes a means for digitizing an audio signal and a memory means for storing the digitized signal in circularly addressed memory locations with more than one hundred milliseconds duration of the audio signal being in memory as digital data at all times, and a means for selectively recovering and combining data from said memory means, thereby providing a composite digital signal comprising the combination of signals of up to fifteen different time delays, thus simulating the composite of sound signals which, due to reflections, have traveled different distances. The ambience simulator allows control of the time delays by selection of the data to be combined, as well as control of the relative magnitudes of the combined signals. A means for converting a series of said composite digital signals to a composite analog signal is also provided. Preemphasis is provided ahead of said means for digitizing the audio signal, and deemphasis is provided following said means for converting a sequence of said composite digital signals to a composite analog signal, thereby achieving greater utilization of the dynamic range of the digital circuitry, and improving the signal-to-noise ratio. A low-level expansion circuit is included which provides reduced amplification for low-level signals, thus increasing the apparent dynamic range.

The analog audio signal is preemphasized, converted to a digital representation, and stored in a memory means in a circular addressing manner. The data is extracted from the memory means in selected portions, providing a composite digital signal which is converted to an analog signal while controlling the amplitude of each of the portions of said composite digital signal. The result is a composite analog signal which contains the simulated time delayed components of the sound which could have occurred in a live performance in an auditorium, and thus are the simulated ambience. The composite signal is then deemphasized and fed to the low-level expansion circuit, thus producing a final output of the ambience simulator which is linear with respect to frequency but which contains reduced low-level signal as compared to the input.

An advantage of the ambience simulator of the present invention is that it is an economical device capable of providing realistic simulations of selectable configurations of auditoriums.

A further advantage is that the fidelity of the signal is preserved by storing digital representations of the audio signal in a memory to obtain the time delays, and convenient control is provided by using digital data to select the delay times and relative signal amplitudes in producing the simulated signal.

A further advantage is that it further includes a preemphasis means and a deemphasis means so that the dynamic range of the ambience simulator is more effectively utilized, and the signal-to-noise ratio is thereby improved.

A further advantage of the present invention is that it further includes a low-level expansion circuit which increases the apparent dynamic range.

A further advantage is that the ambience simulator is suitable for home use and is compatible with the existing commercially utilized recording methods, commonly available home reproduction equipment, and presently prevalent recordings.

These and other objects and advantages of the present invention will no doubt become obvious to those of ordinary skill in the art after having read the following detailed description of the preferred embodiment which is illustrated in the various drawing figures.

IN THE DRAWINGS

FIG. 1 is a diagrammatical block diagram of an ambience simulator in accordance with the present invention;

FIG. 2 is a diagrammatical view of an auditorium configuration illustrating a few of the many sound paths which would be present therein;

FIG. 3 is a diagrammatical view of a typical configuration of sound impinging on a listener in an auditorium; and FIG. 4 is a diagrammatical block diagram of an audio reproduction system including the ambience simulator of the present invention, and illustrating the application of the ambience simulator of the present invention within such a system.

DETAILED DESCRIPTION OF THE PREFERRED EMBODIMENT

Referring to FIG. 1, an ambience simulator referred to by the general reference numeral 50 is provided with a pair of input connectors 72 which are electrically connected to a mixer 74 which is in turn electrically connected to a sensitivity control 76. The sensitivity control 76 is electrically connected to a fifth-order elliptic antialiasing filter 78 which is electrically connected to a preemphasis circuit 80. The preemphasis circuit 80 is connected to a track-and-hold circuit 82 which in turn is electrically connected to comparator 83 which is connected to a successive approximation register 84 at an input connection 86 of the successive approximation register 84. The successive approximation register 84 is provided with an output bus 88 which is electrically connected to a first electronic selection switch 90 at a first input bus 92 on switch 90, and also to a main memory circuit 94. The switch 90 is connected to a digital-to-analog converter 96 which is connected to a second electronic selection switch 98. Second electronic selection switch 98 is provided with a first output terminal 100 and a second output terminal 102. First output terminal 100 of switch 98 is connected back to comparator 83 and second output terminal 102 is connected to an integrate-and-hold circuit 104 which also functions as a deemphasis circuit. The integrate-and-hold circuit 104 is connected to a low-level expansion and level trim circuit 106 which is connected through a second filter 108, a third-order anti-imaging filter, to a second sensitivity control 110. Sensitivity control 76 and second sensitivity control 110 are mechanically connected in a fashion such that increasing the gain of control 76 simultaneously decreases the gain of control 110, and vice versa. Second sensitivity control 110 is connected to a level control 114. Level control 114 is connected to a first ambience simulator output terminal 118 and to a second ambience simulator output terminal 120.

Ambience simulator 50 is provided with manually controlled program select switches 150. Select switches 150 are connected to a programmable read only memory (PROM) 152. PROM 152 is connected to a first temporary holding register 158 and to a delay address generator 160 which is connected to main memory circuit 94. Main memory circuit 94 includes a data output bus 161 which is connected to a second temporary holding register 162. Register 162 is connected to a data input bus terminal 164 of an attenuator 166. Attenuator 166 is also provided with an attenuator control input bus 168. Register 158 is connected to attenuator control input bus 168 of attenuator 166. Attenuator 166 is provided with an output terminal 170 which is connected to a summer 172. Summer 172 is connected to a third temporary holding register 174. Register 174 is connected to an overload limiter 176 which is in turn connected to a fourth temporary holding register 178. Register 178 is connected to a second input terminal 180 on first electronic selection switch 90. Various control signals are present within simulator 50 to coordinate the functioning of the above described elements.

Referring to FIG. 2, there is illustrated a generalized configuration of an auditorium referred to by the general reference numeral 200. The auditorium 200 is shown with a sound source region 202 enclosed within a near wall 204, a far wall 206, a right side wall 208 and a left side wall 210. A listener location 216 is shown within auditorium 200, front and center of the sound source region 202. A point source model location 218 is shown within sound source region 202 and a plurality of radiant sound paths 220, 222, 224, 226 and 228 are illustrated, representing a few of the paths sound would travel from the point source model location 218. Sound path 220 represents primary sound, i.e. sound traveling directly from the source location 218 to listener location 216. Sound paths 222 represent sound traveling from source location 218 to listener through one reflection on side walls 208 or 210. Sound paths 224 illustrate paths reflecting on both one side wall 208 or 210, and far wall 206 before reaching listener location 216. Sound paths 226 illustrate sound paths reflecting on near wall 204 and side walls 208 or 210 before reaching listener location 218. Sound path 228, drawn slightly offset to show both directions, illustrates sound reflected on far wall 206.

It can be seen that there are numerous possible sound paths in a single model illustrated as auditorium 200. In the model illustrated, the sound generated in a sound source region 204 is modeled as emanating from a point source identified as point source model location 218. The location of the listener 216 is chosen as what might be considered to be a preferred seating location. The central location of the source and the listener in the model illustrated creates a symmetry in the reflected sounds.

As shown, the listener is the recipient of primary radiant sound illustrated as path 220, once reflected sound illustrated as paths 222, and twice reflected sound, illustrated as paths 224 and 226. The listener will be the recipient of other sounds also, some of which will have undergone more reflections, but illustration of additional reflections has been omitted for simplicity. It can be seen from FIG. 2 that the distances that sounds travel before reaching the listener depend on the path which such sounds take, and that the listener is therefore the recipient of sounds which, while originating in the same place and time, have traveled different distances. Since sound travels at a speed of approximately 1,000 feet per second in air, the sounds which reach the listener from the same time and location of creation, but which have traveled different length paths, reach the listener at detectably different times. Since sound amplitude decays with distance traveled, and is also attenuated as the sound is reflected at surfaces such as walls 204, 206, 208 and 210 due to partial absorption, the sounds reaching the listener by different paths will vary in intensity in addition to varying in time delay.

In auditoriums where the distances are sufficiently large, and where the surfaces of the walls are sufficiently "live" to reflect rather than absorb most of the sound, the result is that the listener receives a collection of sound signals which are perceptibly different from what would be detected if the listener heard only the sound present in primary radiant sound path 220. The effect of these later and variously attenuated sounds is perceived as a sense of immersion in a sound field and is referred to as ambience. In the home, with relatively short distances available, and relatively sound absorbent surfaces present, very little ambience is generated by the room, and that which is generated impinges upon the listener from a frontal direction in contrast to the lateral directionality of ambience in an auditorium. The ambience simulator 50 of the present invention produces a simulation of the ambience that would have been created by the room if it were large and "live", and is capable of being programmed to simulate the ambience that would be produced by different configurations of auditorium 200.

Referring to FIG. 3, there is illustrated a model of sound distribution referred to by the general reference numeral 250, and diagrammatically showing a typical pattern of received sound for a listener within the auditorium 200 of FIG. 2. A center point 252 represents the listener, and an arrow 254 represents the direction towards the sound source (source location 218 of FIG. 2). Sound impinging on the listener at point 252 is illustrated with lobes representing direction and magnitude. A frontal lobe 256 represents the range of direction likely for primary sound, such as that illustrated by path 220 of FIG. 2, and has the greatest overall intensity, illustrated by the radial dimension of the lobe. A pair of forward lateral lobes 258 represent sound which has been reflected such as along paths 222 and 226 of FIG. 2. A pair of rearward lateral lobes 260 represent sound reflected from behind the listener such as that of path 224 of FIG. 2. A posterior lobe 262 represents the sound reflected directly from the rear wall. The nature of a person's hearing and perception, combined with the difference in timing, result in the greatest awareness to the sound of lobes 256 and 258. Lobes 256 and 258 are therefore representative of the sounds which will normally be reproduced. Additional simulators could be utilized to also simulate the ambience of lobes 260 and 262 even through such an enhancement would be much less significant than the simulation of lobes 258.

Referring to FIG. 4, there is illustrated an audio reproduction system referred to by the general reference numeral 270 and showing the application of the present invention within audio reproduction system 270. Included in the system 270 is an audio signal source 272 electrically connected to a preamplifier 274 which is provided with a pair of output terminals 276. The output terminals 276 are electrically connected to both a stereo power amplifier 278 and to ambience simulator 50 constructed in accordance with the present invention and illustrated in FIG. 1. The ambience simulator 50 is electrically connected to a second stereo power amplifier 282. First stereo power amplifier 278 is connected to a first pair of speakers 284, and second stereo power amplifier 282 is connected to a second pair of speakers 286.

The preamplifier 274 receives a signal as an analog electrical signal from source 272 and amplifies it. Various tone control procedures and corrections for frequency spectrum distortions are typically provided in preamplifiers built in accordance with techniques known in the art and commercially practiced. Output terminals 276 provide the signal to power amplifier 278 which amplifies the signal and drives speakers 284 with the audio analog signal. The portions of system 270 above described constitute what is a typical home audio reproduction system. The addition of ambience simulator 50 to what is otherwise a currently typical home system is accomplished, as shown in FIG. 4, by connecting output terminals 276 to ambience simulator 50 as well as to power amplifier 278, and by connecting ambience simulator 50 to second power amplifier 282 which drives speakers 286. Second stereo power amplifier 282 is a typical power amplifier, not necessarily different from power amplifier 278. Power amplifier 282 and/or power amplifier 278 could be built into the same box as simulator 50. In applying system 270 in the home, a typical physical arrangement would be to arrange speakers 284 in front of the general listening area with a distance separating them, and to provide speakers 286 to the sides and slightly forward of the general listening area. Thus, speakers 284 would be arranged in accordance with the common practice for stereo audio systems, and speakers 286 would be added in a position corresponding with the direction from which most of the early reflected sounds impinge upon a listener in an auditorium, as illustrated in FIG. 2 and FIG. 3.

Turning now to FIG. 1, the functioning of the ambience simulator 50 itself will be discussed. Stereo signals on input connectors 72 are mixed in mixer 74, which is a simple adder circuit, to provide a single, monaural analog signal. The monaural signal from mixer 74 is adjusted through the manually adjustable sensitivity control 76 such that the signal amplitude matches the characteristics of the subsequent circuitry, thus allowing maximum utilization of the dynamic range of the circuitry. From the sensitivity control, the analog signal is fed through filter 78 which prevents aliasing distortion. With digitization of audio signals, there is a tradeoff between cost and frequency response in the digital circuitry. The higher end of perceptable audio is not essential to ambience simulation, and hence a typical implementation of the present invention will have a high frequency response limit lower than the frequency response capacity of the analog circuitry which is providing the signal to the ambience simulator. Filter 78 allows the connection of an economically designed simulator to a source which provides signals containing higher frequencies than the digital circuits can handle.

The filtered signal from filter 78 is then subjected to preemphasis by preemphasis circuit 80 which acts to attenuate low frequencies more than high frequencies. Since typical music signals have more low frequency energy then high frequency energy, preemphasis allows more effective utilization of the dynamic range of the digital portion of the simulator 50. Track-and-hold device 82 tracks the analog audio signal and then holds the analog level in accordance with a control signal. The output of the track-and-hold device 82 is therefore a sampled representation of the analog signal fed to it, and the sampling rate of this process controls the maximum frequency of the analog signal that can be represented without aliasing distortion. The conversion to a digital representation of each of the samples of the analog signal is accomplished by the combination of the successive approximation register 84, the digital-to-analog converter 96 and comparator 83. In a series of steps, repeated for each sample of the analog signal provided from track-and-hold device 82, the combination of successive approximation register 84, converter 96, and comparator 83 converge to a digital approximation in register 84 of the sample of the analog signal. The digital value is then stored in the main memory circuit 94 and the circuitry is ready to proceed with determining the digital value for the next sample of the analog signal. Each sucessive digital value is stored at an address in memory circuit 94 decremented one from the address location in which the previous value was stored. At the last location, the addressing is reset to the highest address resulting in a circular addressing operation. Each time that the track-and-hold device 82 provides a sampled value, the subsequent circuitry creates and stores a digital representation of that sample before a new sample is provided by track-and-hold device 82. The period of time from when track-and-hold device 82 provides a sample until it provides the next sample is referred to as a sample period. It should be noted that a first electronic selection switch 90 is provided ahead of the digital-to-analog converter 96 and a second electronic selection switch 98 is provided following the digital-to-analog converter 96 in a manner which allows, by switching both switches 90 and 98, the removal of the digital-to-analog converter 96 from the above described circuitry and process, and further allows its use for a separate functional part in simulator 50 described below.

The quantity of memory and the sampling rate for digital representations (the sampling rate of the track-and-hold device) control the maximum delay of the main memory 94. The preferred embodiment of the present invention includes using sufficient addressable memory within the main memory circuit 94 to enable storage for a time exceeding one hundred milliseconds. Capability for a delay time exceeding fifty milliseconds is necessary for effective ambience simulation of even small auditoriums, and a delay of at least one hundred milliseconds is necessary for effective ambience simulation of full-sized concert halls.

The selection of the data extracted from main memory 94 controls the content of the signal ultimately assembled and provided by the ambience simulator 50. The address of the digital data representing a sample of the audio signal at a given delay changes with each sample period. In order to extract a sequence of digital representations of the input analog signal which constitutes a piecewise representation of a single delayed audio signal, it is necessary to extract the data from main memory circuit 94 from sequentially indexed memory addresses. The reproduction of multiple delayed audio signals requires multiple data extractions, indexing a multiplicity of addresses for each sample.

The process of address generation for data extraction is performed by the delay address generator 160. Addresses are generated from data provided by PROM 152 in segments and assembled in the delay address generator 160. The addresses for each extraction correspond to a particular delay, and are decremented once each sample period in the delay address generator 160. The delay address generator 160 must provide an address to the main memory circuit 94 for each delayed signal to be produced, all within each sample period. In addition to controlling the selection of delayed signals for which representations are extracted from the main memory circuit 94, the PROM 152 also contains the information used to control the amplitude of each of the delayed signals. An attenuation factor is associated with each delay time in the PROM 152. Each time that an incremental digital representation corresponding to a particular delay time is output to data output bus 161 of main memory circuit 94, and thus supplied to register 162, an attenuation factor is also supplied from PROM 152 to register 158. Attenuator 166 which utilizes a shift register, accepts the data from register 162 and shifts it in accordance with the attenuation factor information from register 158. The attenuator 166, by being shifted, thus acts as an attenuator controllable in six dB steps. Each attenuated representation of an incremental value for one delayed signal is added to each of the other digital representations for each other delayed signal, thus creating a composite digital representation of the combined signals. This addition is accomplished by the combination of summer 172 and register 174. Each of the digital representations for the various delays are added together within each sample period, and the result tested by overload limiter 176 to assure that the process of adding all of the signals did not result in the digital value exceeding the capacity of register 174. Overload limiter 176 is constructed such that if the signal reaches the maximum amplitude of either polarity that the system is capable of handling, limiter 176 will maintain that maximum value rather than allow the signal to wrap around to maximum amplitude of the opposite polarity as would otherwise be the case. At the beginning of each new sample period, register 174 is cleared.

The acoustic qualities of an auditorium are modeled as a combination of delay times for audio signals with accompanying attenuation factors. Thus the entire modeling for an auditorium is contained in PROM 152. By including different programs in PROM 152 various auditoriums can be representated. The preferred embodiment of the present invention includes four separate programs in PROM 152, which are selected by the manually controlled select switches 150 which simply control two bits on the address bus of PROM 152.

The collection of combinations of delays and attenuation factors contained in the programs in PROM 152 are selected to allow accurate simulation of the sounds actually present in an auditorium. Various models have appeared in the literature for modeling such sounds, and a great deal of variation is possible in the approach taken. Basically, the more accurately the program reflects the actual delay/amplitude combination produced by a real auditorium, the more real the music will sound. On the other hand, it is possible to create an ambience effect that would never be attained in a real auditorium if such is desired. By using a model which combines (through simple addition) those signals which are approximately simultaneous, a single delayed signal can be representative of several temporally close signals. The assumed symmetry of the model illustrated in FIG. 2 makes it possible to generate the reflected sounds in both of lobes 258 of FIG. 3 only once and to obtain the desired directional distribution by emitting that one signal from the appropriately positioned speakers. The use of those techniques allows realistic simulation of the entire ambience period with only fifteen discrete delays, and possibly with even less. It is believed that realistic ambience simulation cannot be attained unless more than twelve individual discrete delayed signals are produced.

The output of overload limiter 176, which is either the contents of register 174, or the maximum amplitude of either polarity which overload limiter 176 can attain, is provided to register 178. As previously described, digital-to-analog converter 76 is used in the process of determining the digitization of the representative sample from track-and-hold device 82, but can be switched by electronic switches 90 and 98 to a different portion of the circuitry of ambience simulator 50. Digital-to-analog converter 96 is switched to the output side of the digital circuitry once in each sample period, and converts the digital contents of register 178 to an analog signal which it provides, through switch 98, to the integrate-and-hold circuit 104.

There are multiple levels of timing in ambience simulator 50 such that for each sample period, data is written into one addressable location of memory 94, fifteen data are extracted from memory 94, and one composite datum is converted to an analog signal by digital-to-analog converter 96. The sample period governs the high frequency response of ambience simulator 50. The process of developing the digital representation of the sample of the analog signal requires multiple iterative operations within that sample period. Simultaneous with that iterative process, a multiplicity of data are extracted from main memory circuit 94 attenuated in attenuator 166 and assembled by the combination of summer 172 and register 174 to provide an output sample for that sample period. That output representation is a composite digital signal representing a composite of the delayed signals. In the preferred embodiment, fifteen digital representations, each representing a different delay, are combined to produce each composite digital signal, and the sample period is sufficiently short so as to allow the digital representation of signals of a frequency up to at least 10 kHz.

After successive approximation register 84 has completed its part in the process of digitizing the sample from the track-and-hold device 82, electronic switches 90 and 98 are switched to allow converter 96 to convert the digital representation from the prior sample period which is in register 178 to an analog representation, and to supply that analog representation to the integrate-and-hold device 104. Electronic switches 90 and 98 then return to their prior state, register 178 receives the new composite representation generated in register 174, register 174 is cleared, and the next sample period can begin.

The integrate-and-hold circuit 104 performs the process of assembling the signals provided from converter 96 into a continuous signal. The integrate-and-hold circuit 104 is constructed in a manner such that its response is non-linear with frequency and thereby provides deemphasis to the signal, thus compensating for preemphasis provided by preemphasis circuit 80. In addition, a nonlinearity is built into the integrate-and-hold circuit 104 which acts as a low frequency cut off. This attenuates signals with frequencies below about 75 Hz. The effect of attenuating these low frequency signals is to simulate the effect of those low frequency signals passing through rather than reflecting from auditorium walls.

Following the integrate-and-hold circuit 104, the signal is supplied to the low-level expansion and level trim circuit 106 which reduces the gain for low-level signals, and provides a limited-range gain control. Since low-level ambience contributes little to the perception of ambience, the reduction of gain for low-level signals detracts very little from the perceived ambience, but signficantly reduces perceived noise. The signal is then fed through the second filter 108, a third-order antiimaging elliptic filter which compensates for images produced by the sampling process, and to the second sensitivity control 110. Sensitivity controls 76 and 110 are mechanically connected such that increase in the gain of one decreases the gain of the other. The result is that changing the settings of sensitivity controls 76 and 110 does not affect overall gain, but does affect signal levels between controls 76 and 110. This adjustment is available so that within the intervening circuitry, the signal can be set at a level sufficient to utilize the dynamic range of the circuitry, thus improving the signal-to-noise ratio, but also such that overload in the intervening circuitry can be prevented.

Following sensitivity control 110, the signal is fed to level control 114 which provides the control of the signal level to output terminals 118 and 120.

Except for amplitudinal differences controllable with level control 114, the output terminals 118 and 120 provide the identical signal. The provision for two output terminals is to allow easy interconnection with common stereo amplifiers.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. An ambience simulator comprising in combination:
   an input connection means for receiving into the ambience simulator an electrical signal wherein said electrical signal corresponds to an audio signal;
   a storage means for storing a representation of said electrical signal provided by the input connection means;
   a recovery means for recovering said representation of said electrical signal from the storage means as a plurality of more than twelve delayed signals, with each of said delayed signals being a substantial reproduction of said representation of said electrical signal at a delay, which delay is distinct from the delay of each other of said delayed signals;
   an attenuating means connected to receive said delayed signals and for attenuating each of said delayed signals at a preselectable amount of attenuation, with said attenuation being separately selectable for each of said delayed signals;
   a combining means connected to receive and combine said delayed signals after each said delayed signal has been attenuated, thereby forming a composite signal;
   whereby said composite signal represents an ambience signal representative of an ambience which could be generated by an actual auditorium.

2. The ambience simulator of claim 1 wherein the recovery means is constructed to extract fifteen delayed signals.

3. The ambience simulator of claim 1 further comprising:
   a preemphasis means connected for providing preemphasis to said audio signal before said representation of said electrical signal is stored;
   a deemphasis means connected for providing deemphasis to said composite signal and for attenuating those spectral components of said composite signal below seventy-five Hz from said composite signal; and
   a low-level expansion means connected for providing low-level expansion to said composite signal which attenuates low amplitude signals that contribute to perceived noise, but do not contribute significantly to perceived ambience;
   whereby the signal-to-noise ratio and the apparent dynamic range of the ambience simulator as well as the perceived quality of the simulated ambience are all improved.

4. The ambience simulator of claim 1 wherein said storage means includes memory for storing said representation of said electrical signal in digital form.

5. The ambience simulator of claim 4 wherein selection of said delayed signals and the amount of attenuation of each of said delayed signals are implemented by one of a plurality of programs stored in digital form in the ambience simulator.

6. The ambience simulator of claim 4 wherein the attenuating means for attenuating each of said delayed signals is constructed to attenuate in logarithmic increments of 6 db.

7. The ambience simulator of claim 4 wherein said storage means is constructed to store a sufficient amount of data to allow more than fifty milliseconds of said electrical signal to be represented in said storage means at any instant in time; and further comprising
   digitizer means for converting said electrical signal to a representative digital signal before storage in said storage means; and
   a digital-to-analog converter to convert said composite signal to an analog signal.

8. The ambience simulator of claim 7 wherein
   the digital-to-analog converter connected to convert said composite signal from a digital signal to an analog signal is also connected through switching means to operate in combination with a comparator means and a successive approximation register to form the digitizer means.

9. The ambience simulator of claim 8 further comprising:
   a preemphasis means connected for providing preemphasis to said electrical signal before said representation of said electrical signal is stored;
   a deemphasis means connected for providing deemphasis to said composite signal and for attenuating those spectral components of said composite signal below seventy-five Hz from said composite signal; and
   a low-level expansion means connected for providing low-level expansion to said composite signal which attenuates low amplitude signals that contribute to perceived noise but do not contribute significantly to perceived ambience;
   whereby the signal-to-noise ratio and the apparent dynamic range of the ambience simulator, as well as the perceived quality of the simulated ambience are all improved.

10. An ambience simulator comprising in combination:
    a digitizing means for digitizing an input analog signal, including a track-and-hold device to receive said analog signal and provide a series of sampled representations of said analog signal, a comparator, a successive approximation register and a digital-to-analog converter, with said comparator, said successive approximation register and said digital-to-analog converter being arranged to function together to provide digital approximations of said sampled representations of said analog signal;

a storage memory means for storing a quantity of said digital approximations representing an interval of time exceeding 50 milliseconds, the storage memory means including a plurality of addressable locations and wherein said digital approximations are applied to sequentially decremented address locations in said memory means, and wherein following application of one of said digital approximations to the last memory location, the addressing is reset to the highest address memory location;

a recovery means for producing a composite digital signal by recovering, selectively attenuating and combining a plurality of the digital approximations stored in said storage memory means, with said recovery means being capable of performing such recovering, attenuating and combining of said plurality of digital approximations once each time one of said sample representations of said analog signal is digitized and stored in said storage memory means; and a converting means for converting a sequence of said composite digital signals to a composite analog signal;

wherein the ambience simulator produces the composite analog signal output comprising a plurality of representations of the input analog signal with each such representation of said input signal corresponding to a different time delay as compared with each other representation of said input signal contained in said composite analog signal.

11. The ambience simulator of claim 10 further comprising a combining means constructed to combine a plurality of analog signals to form a single analog signal corresponding to the sum of said plurality of analog signals wherein said single analog signal is the input analog signal provided to said digitizing means, whereby the operation of the ambience simulator is facilitated with signals provided in multi-channel format such as conventional stereo recordings.

12. The ambience simulator of claim 10 further comprising:

a preemphasis means connected for providing preemphasis to said analog signal before said analog signal is digitized by the digitizing means;

a deemphasis means connected for providing deemphasis of said composite analog signal and for attenuating those spectral components of said composite analog signal below seventy-five Hz; and a low-level expansion means connected for providing low-level expansion to said composite analog signal which attenuates low frequency signals that contribute to perceived noise, but do not contribute significantly to perceived ambience;

whereby the dynamic range of the ambience simulator is more fully utilized and the perceived quality of the simulated ambience is improved.

13. The ambience simulator of claim 10 wherein said digital-to-analog converter of the digitizing means is connected to also provide said means for converting said sequence of said composite digital signals to a composite analog signal.

14. An audio system comprising in combination;

an input connection means for receiving a plurality of two primary electrical signals corresponding to a stereophonic audio signal;

a first amplifying means connected to the input connection means for amplifying said electrical signals;

a first sound reproduction means connected to the amplifying means for separately converting each of said electrical signals to sound after said electrical signals have been amplified by the first amplifying means;

an ambience simulator means connected to the first amplifying means for receiving said electrical signals and producing a composite signal comprising a combination of a plurality of delayed electrical signals where each delayed electrical signal corresponds to a combination of said two primary electrical signals, at a specific time delay, and at a specific attenuation;

a second amplifying means connected to the ambience simulator means for amplifying said composite signal; and a second sound reproduction means connected to the second amplifying means for converting said composite signal to sounds after said composite signal has been amplified by the second amplifying means;

wherein the amount of delay and the amount of attenuation associated with each of said delayed electrical signals can be individually programmed in the ambience simulator means; and whereby the two primary electrical signals are amplified and converted to sound in the first sound reproduction means, and a channel of sound is synthesized representing ambience, with the relative direction of impinging sound from the ambience channel upon a listener being controlled by physical placement of the second sound reproduction means with respect to the placement of the first sound reproduction means and the location of the listener.

* * * * *